(12) United States Patent
Chou et al.

(10) Patent No.: US 6,713,238 B1
(45) Date of Patent: Mar. 30, 2004

(54) MICROSCALE PATTERNING AND ARTICLES FORMED THEREBY

(76) Inventors: Stephen Y. Chou, 7 Foulet Dr., Princeton, NJ (US) 08540; Lei Zhuang, 603 Lawrence Apts., West Drive, Princeton, NJ (US) 08540

( * ) Notice: Subject to any disclaimer, the term of this patent is extended or adjusted under 35 U.S.C. 154(b) by 0 days.

(21) Appl. No.: 09/807,266

(22) PCT Filed: Oct. 8, 1999

(86) PCT No.: PCT/US99/23717
§ 371 (c)(1), (2), (4) Date: Jun. 11, 2001

(87) PCT Pub. No.: WO00/21689
PCT Pub. Date: Apr. 20, 2000

Related U.S. Application Data

(60) Provisional application No. 60/103,790, filed on Oct. 9, 1998.

(51) Int. Cl.[7] .............................. G03F 7/00; B05D 3/00
(52) U.S. Cl. ....................... 430/322; 430/311; 430/313; 430/330; 427/271; 427/472; 428/338; 264/299
(58) Field of Search ................................ 430/311, 313, 430/322, 330; 101/3.1; 427/271, 472; 264/299; 428/338

(56) References Cited

U.S. PATENT DOCUMENTS

| | | | | |
|---|---|---|---|---|
| 4,031,268 A | | 6/1977 | Fairbairn | 427/448 |
| 4,407,695 A | * | 10/1983 | Deckman et al. | 156/643 |
| 4,545,610 A | | 10/1985 | Lakritz et al. | 438/125 |
| 4,801,476 A | * | 1/1989 | Dunsmuir et al. | 427/430.1 |
| 5,460,922 A | | 10/1995 | Swirbel et al. | 430/315 |
| 5,772,905 A | | 6/1998 | Chou | 216/44 |
| 5,997,958 A | * | 12/1999 | Sato et al. | 427/468 |
| 6,309,580 B1 | * | 10/2001 | Chou | 264/338 |
| 6,482,742 B1 | * | 11/2002 | Chou | 438/690 |
| 2002/0042027 A1 | * | 4/2002 | Chou et al. | 430/322 |
| 2002/0127498 A1 | * | 9/2002 | Doshi et al. | 430/322 |

* cited by examiner

Primary Examiner—Mark F. Huff
Assistant Examiner—Nicole Barreca
(74) Attorney, Agent, or Firm—Raymond A. Miller; Pepper Hamilton LLP

(57) ABSTRACT

The formation of self-assembled patterns in a substrate through deformation induce by a mask placed above the substrate are disclosed. Methods of the present invention may be used to form arrays of nanometer sized pillars as well as mesas from a thin deformable layer of the substrate or a thin film of material deposited on the substrate.

22 Claims, 15 Drawing Sheets

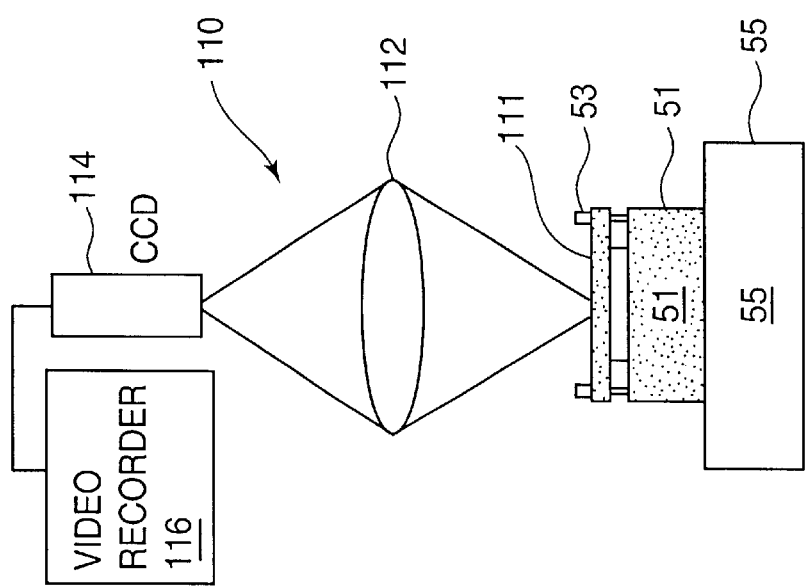
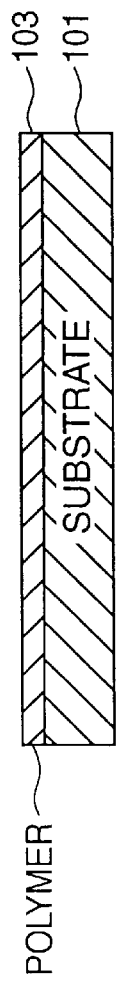
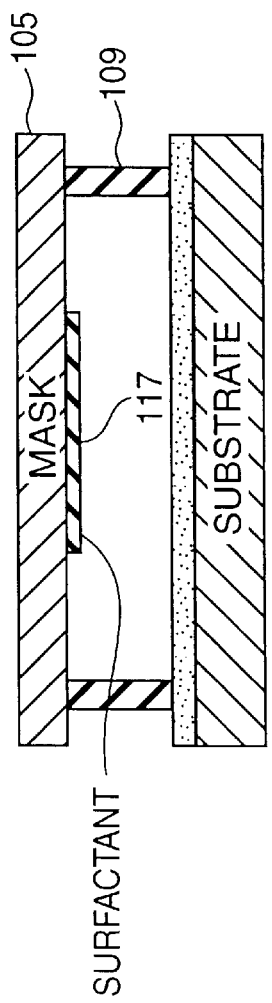
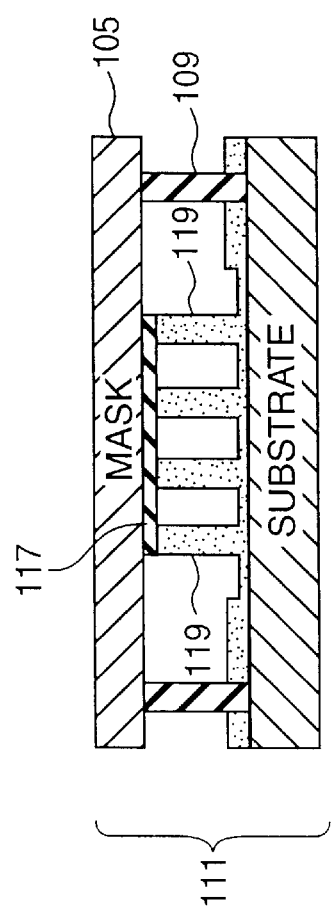
FIG. 7Ai  FIG. 7Aii  FIG. 7Aiii  FIG. 7B

0 SEC

58:21

59:17

60:44

1:01:41

1:01:48

1:01:49

1:01:54

0 SEC

9 SEC

58 SEC

2:59

27:01

29:14

49:47

28:09

1:35:12

1:38:53

2:05:29

2:12:03

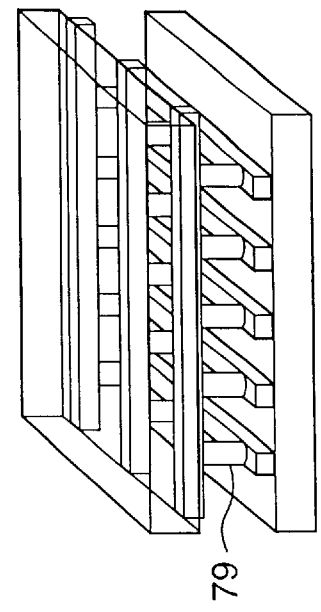
FIG. 14B
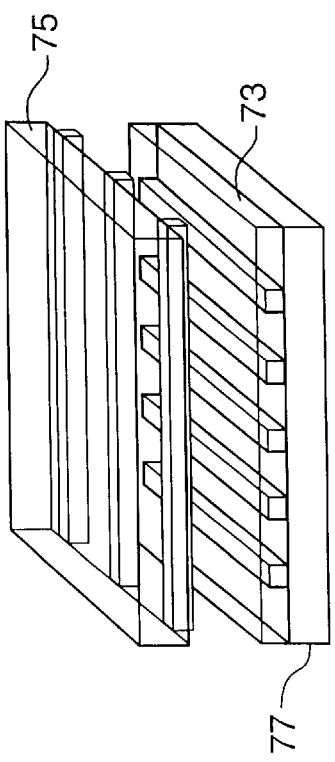
FIG. 14D
FIG. 14A
FIG. 14C

MICROSCALE PATTERNING AND ARTICLES FORMED THEREBY

CROSS REFERENCE TO RELATED APPLICATION

The benefit of U.S. Provisional Patent Application Serial No. 60/103,790 filed on Oct. 9, 1998 is claimed.

GOVERNMENT INTEREST

This invention was made with Government support under Contract No. 341-6086 awarded by DARPA. The Government has certain rights in this invention.

FIELD OF THE INVENTION

The present invention relates generally to forming patterns on or in a surface material, assemblies used therefor, and articles formed thereby. More specifically, the present invention relates to microscale patterning and/or lithography. Microscale patterning and microscale lithography have a broad spectrum of applications, e.g. in the production of integrated circuits, microdevices, and the like. The patterns formed can be utilized to perform an array of functions, including electrical, magnetic, optical, chemical and/or biological functions.

BACKGROUND

One of the key processing methods in fabrication of semiconductors, integrated electrical circuits, integrated optical, magnetic, and mechanical circuits and microdevices is forming very small patterns.

Lithography is often used to create a pattern in a thin film carried on a substrate so that, in subsequent process steps, the pattern will be replicated in the substrate or in another material which is added onto the substrate. One purpose the thin film satisfies is protecting a part of the substrate so that in subsequent replication steps, the unprotected portion can be selectively etched or patterned. Thus, the thin film is often referred to as a resist.

A typical lithography process for the integrated circuits fabrication involves exposing a resist with a beam of energetic particles which are electrons, or photons, or ions, by either passing a flood beam through a mask or scanning a focused beam. The particle beam changes the chemical structure of the exposed area of the film, so that when immersed in a developer, either the exposed area or the unexposed area of the resist will be removed to recreate the pattern or obverse of the pattern, of the mask. A limitation this type of lithography is that the resolution of the image being formed is limited by the wavelength of the particles, the particle scattering in the resist, the substrate, and the properties of the resist. Although pattern sizes greater than 200 nm can be achieved by photolithography, and pattern sizes in the range of 30 nm to 200 nm can be achieved utilizing electron beam lithography, these methods are resource intensity and suffer from low resolution.

U.S. Pat. No. 5,772,905 describes a method and apparatus for performing ultra-fine line lithography wherein a layer of thin film is deposited upon a surface of a substrate and a mold having at least one protruding feature and a recess is pressed into the thin film.

An alternative strategy to those described above is to use a "naturally occurring" or "self-assembly" structure as a template for subsequent parallel fabrication. For example, U.S. Pat. No. 4,407,695 and U.S. Pat. No. 4,801,476 describe a spin coating technique to prepare close-packed monolayers or colloidal polystyrene spheres with diameters of typically 0.1–10 microns on solid substrates. The pattern is then replicated by a variety of techniques, including evaporation through the interstices, ion milling of the spheres and/or the substrates, and related techniques. Highly ordered biologically membranes ("S-layers") have also been suggested as starting points for fabrication. Close packed bundles of cylindrical glass fibers, which could be repeatedly drawn and repacked to reduce the diameters and lattice constant have also been used. Block copolymer films have been suggested for use as lithography masks wherein micelles of the copolymer which form on the surface of a water bath are subsequently picked up on a substrate.

To date, the focus of "self-assembly" has been primarily on either phase separation of a polymer blend, of di-block copolymers, or of local modification of surface chemistry (i.e., chemical lithography). In self-assembly by phase separation, the periodic structures are multidomain, and their orientation and locations are uncontrollable and random. A long-sought after goal in self-assembly is precise control of the orientation and location of a self-assembled polymer structure.

There is an ongoing need to produce progressively smaller pattern size. There also exist a need to develop low-cost technologies for mass-producing microscale and sub-micron (e.g. nanometer) structures. Microscale, indeed nanoscale and smaller, pattern technology will have an enormous impact in many areas of engineering and science. Both the future of semiconductor integrated circuits and the commercialization of many innovative electrical, optical, magnetic, and mechanical microdevices that are far superior to current devices will depend on such technology.

SUMMARY OF THE INVENTION

Technologically, self-assembly promises not only low-cost and high-throughput, but also other advantages in patterning microstructures, which may be unavailable in conventional lithography.

The present invention is generally directed to the formation of patterns in a material through deformation induced by a mask placed above a material, as well as assemblies used therefor, and products formed thereby. An important aspect of the present invention is novel method, referred to herein as "lithographically-induced self-assembly" (LISA). In this process a mask is used to induce and control self-assembly of a deformable surface, preferably a thin film into a pre-determined pattern. One advantage of the present invention is relatively accurate control of the lateral location and orientation of a self-assembled structure. Preferably, a substantially uniform, film is cast on a substrate. A mask, preferably with protruding patterns representing the pattern to be formed in or on the film, is placed above the film, but physically separated from the film by a gap. The mask, the film, and the substrate are manipulated, if necessary, to render the film deformable. For example in the case of a polymer, the polymer film may be heated to a temperature above the polymer's glass transition temperature and then cooled down to room temperature. During the heat-cool cycle, the initially flat film assembles into discrete periodic pillar arrays. The pillars, formed by rising against the gravitational force and surface tension, bridge the two plates to form periodic pillar arrays. The pillars generally have a height equal to the plate-mask separation. Moreover, if the surface of the mask has a protruding pattern, the pillar array is generally formed only under the protruding pattern with the edge of the array generally aligned to the boundary of the mask pattern. After the pillar formation, due to a constant polymer volume, there is little polymer left in the area between pillars. The shape and size of the mask pattern can be used to determine the pillar array's lattice structure. The location of each pillar can be controlled by the patterns on the mask. This process can be used repeatedly to demagnify the self-assembled pattern size. This demagnification permits a self-assembled structure to have a size smaller than that of the mask pattern(s). If the demagnification is used repeatedly, a size much smaller than that by a single self-assembly process can be achieved. This would allow for progressively smaller pattern-mask-patterns to be formed. The basic LISA process can also be modified to form a non-pillared pattern that is substantially identical to the features of the mask.

One embodiment of the present invention is a patterning method or method of patterning which comprises depositing a material on a substrate. The material and substrate may be already formed, and the material and substrate may be the same or different. In this case the step of depositing a material would not be necessary, but rather a surface layer(s) would be selectively manipulated so that a pre-determined thickness of surface material is deformable. This thickness must be small enough that the mask can interact with the material through the separation distance to form a contact therebetween. As is described more fully herein, the thin film or surface layer(s) preferably has a thickness in the range of about 1 nm to about 2,000 nm, more preferably about 10 nm to about 1,000 nm, more preferably about 100 nm to about 500 nm and even more preferably about 50 nm to about 250 nm. If the deposited material is deformable at room temperature (e.g., a liquid polymer or polymer dispersion, the material may not need to be deformed). If a liquid polymer is used, it may be cured (e.g., photo curing) after either pillar formation, usually before removal of the mask. For a solid material, it may be necessary to render the material deformable, e.g. by heating to a temperature where the material may flow. Deforming by heat is a preferred route, but the material or surface layer(s) may also be deformed by other routes (e.g., chemical reactions). Heating may occur by any conventional means (e.g., laser, light sources, heat radiating or microwave induction), and the heat may be pulsed or continuous.

It is important that the mask be maintained above the material or film. A spacer (which may be integrally or non-integrally formed with the mask) is convenient to this end. However, an assembly may be used wherein the mask is maintained above said material without resorting to a spacer. The substrate can be any number of compositions which are capable of supporting the film, but the present invention has particular applicability to substrates which are, themselves intended to be processed to have patterns formed thereon or therein. The substrate can have pre-existing relief patterns or be flat.

The mask can be of any suitable material as described herein in many cases, the mask, will often be very similar in composition to the underlying substrate. Indeed, it is envisioned to use a suitably patterned substrate from a previous LISA process in a second or more LISA process or LISC process. The mask can have any suitable surface coating and the protrusion may be formed from a surfactant or other suitable protruding material (e.g., monolayers or self-assembled monolayers) with a different surface energy. The protruding pattern may be of varying heights on the same pattern resulting in like pillars. Of course, any combination of protrusion pattern protrusion coating or monolayer material pattern may be used to form the relief structure.

Another embodiment of the present invention is the relief structure formed by either or both the LISA and LISC process.

BRIEF DESCRIPTION OF THE DRAWINGS

The features, aspects, and advantages of the present invention will become better understood with regard to the following description, appended claims, and accompanying drawings wherein:

FIG. 7(*a*) illustrates schematically lithographically-induced self-assembly using a surfactant as the pattern: (i) A thin layer of homopolymer cast on a flat silicon wafer. (ii) A mask of surfactant patterns placed a distance above the PMMA film, but separated by a spacer. (iii) During a heat-and-cool cycle, the polymer film self-assembled into a periodic supramolecular pillar array. (b) Schematic of the experimental setup;

FIG. 14 illustrates Self-Assembly (SALSA) of a Random-Access Electronic Device.

DETAILED DESCRIPTION OF THE PRESENT INVENTION

Figure 1A:
FIG. 1 schematically illustrates lithographically-induced self-assembly (LISA): (a) a flat substrate, (b) a thin layer of deformable material deposited thereon, (c) a mask with a protruding pattern a distance above the deformable material; and (d) self-assembly into a periodic supramolecular pillar array after a heat-and-cool cycle.
Figure 1B:
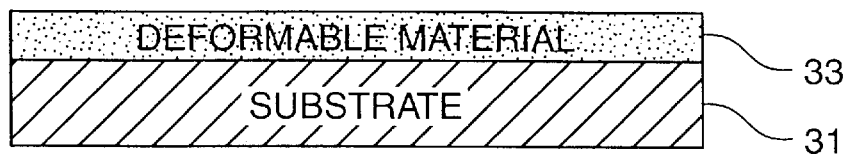
Figure 1C:
Figure 1D:
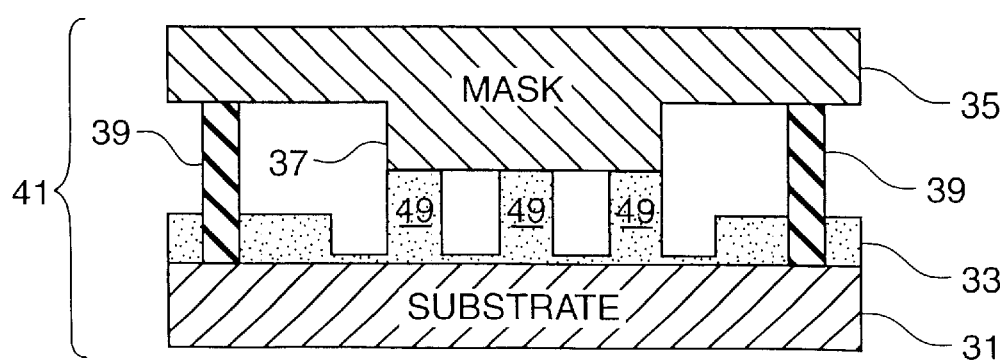

It is to be understood that the invention is not limited to a specific article of manufacture or technique described herein, and may be implemented in any appropriate assembly or process. Additionally, it should be understood that the invention is not limited to any particular material or substrate. As is described herein, a variety of types of materials and/or substrate may be used.

As described herein, placing a mask a distance above a surface, preferably a thin deformable surface results in the formation of a self-assembled periodic supramolecular array of pillars during a heat-and-cool cycle. The pillars are formed in the area under the protruding mask pattern and are normal to the substrate. The pillars generally extend all the way to the mask (or to protrusion patterns on the mask). The location of each pillar as well as the size, shape, and lattice structure of the array can be controlled by the patterns on the mask with a great deal of precision. The period and diameter of the pillars also can be controlled, depending, for example, on the molecular weight of the polymer. Both the period and diameter generally become smaller as the lower molecular weight of the polymer is lowered. Although not intending to be bound by theory, it appears the LISA process involves a delicate interplay of surface-roughening, long-range Van der Waals forces between the surface and the mask, surface melt flow, wetting properties of both mask and substrate, trapping of triple-phase lines, and balance of attractive and repulsive forces. LISA is extendable to other materials such as semiconductors, metals, and biological materials. The application of LISA and related technologies described herein opens up numerous applications in microelectronics information storage, new materials, biology, and chemistry.

Turning with specificity to the figures, FIG. 1 schematically illustrates the lithographically induced self-assembly of the present invention. Onto the substrate 31 is layered a material 33, which in the preferred embodiment, is a thin layer of a homopolymer, preferably polymethylmethacrylate (PMMA). The PMMA was first spun on substrate 31, in this case, a silicon wafer having a substantially plain flat surface, followed by baking at 80° C. to drive out the solvent. Next a mask 35, that faces a deformable material 33 is placed above the PMMA film 33. As is shown in FIG. 1, the mask 35 is separated, using a spacer 39, from the PMMA by several hundred nanometers. The distance between the protrusion 37 and film 33 is preferably in the range of about 10 nm to 1000 nm, more preferable 50 nm to 800 nm, and even more preferably that about 100 nm to about 700 nm. The spacer 39 may be either integrally formed within the mask or a separate element (see e.g. FIG. 12).

Figure 8A:
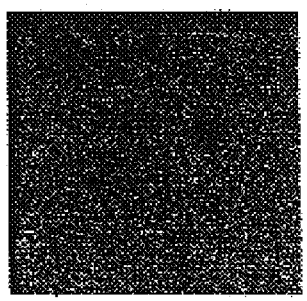
FIG. 8 shows the observed dynamic behavior of the growth of the first pillar under a square mask pattern at 120° C. (a) The polymer was featureless before heating the system. The beginning of 120° C. was set as time zero. (b)–(f) At 120° C., the polymer under the corners of the mask pattern is being pulled up, (g) the first pillar just touched the mask; (h)–(i) the pillar expanded to its final size.
Figure 8B:
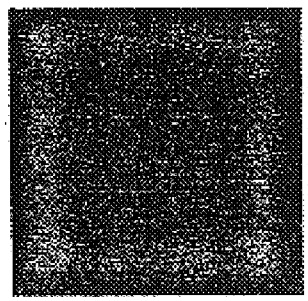
Figure 8C:
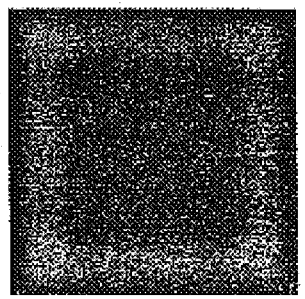
Figure 8D:
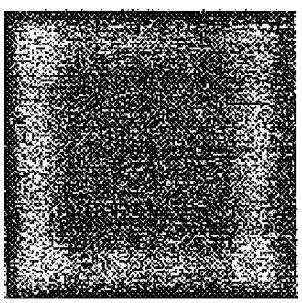
Figure 8E:
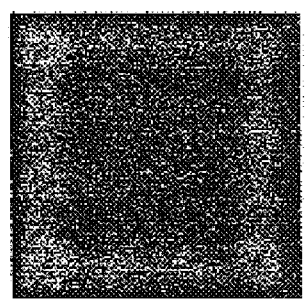
Figure 8F:
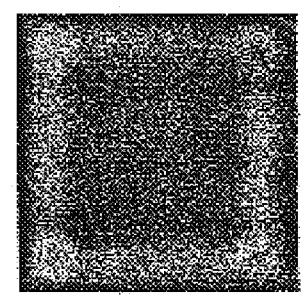
Figure 8G:
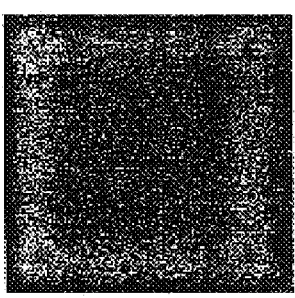
Figure 8H:
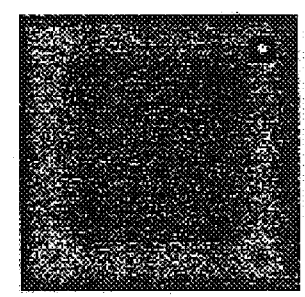
Figure 8I:
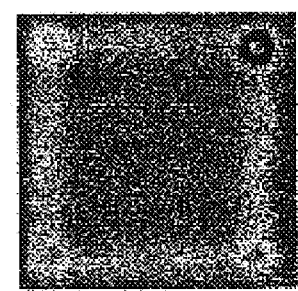
Figure 9A:
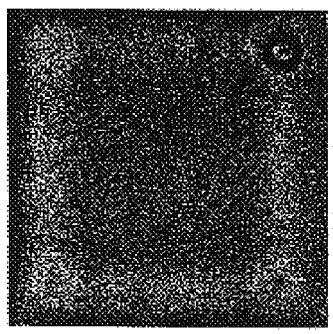
FIG. 9 shows the observed dynamic behavior of the growth of an array formed under the square mask pattern at 120° C. from the first pillar to the last pillar. The pillars were formed in an orderly manner, one by one, first under the corners of the mask pattern, then along the edges, later new corners and new edges, until the area under the mask pattern was filled with pillars. The completion of the first pillar was set as time zero.
Figure 9B:
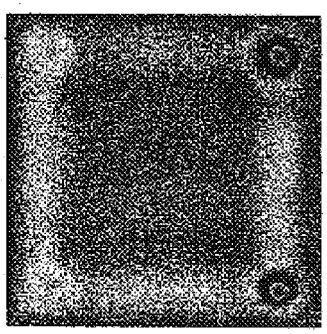
Figure 9C:
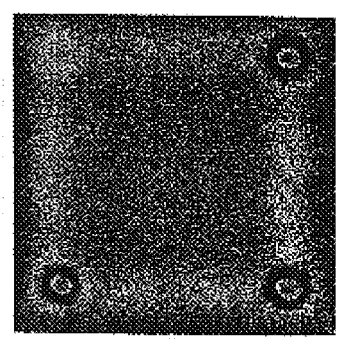
Figure 9D:
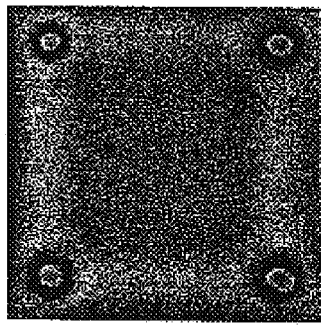
Figure 9E:
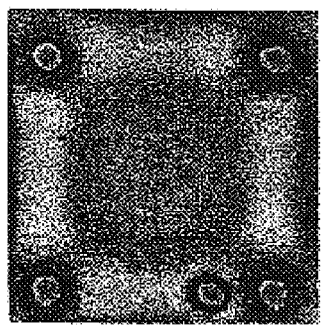
Figure 9F:
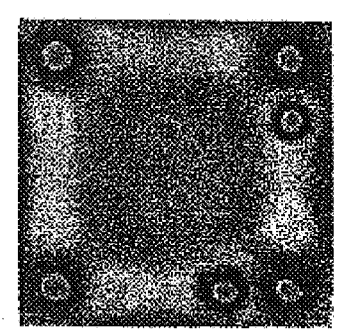
Figure 9G:
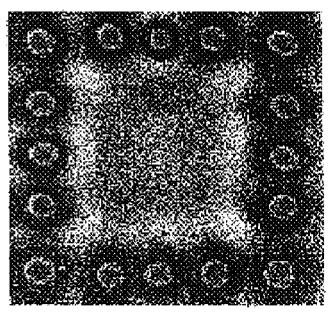
Figure 9H:
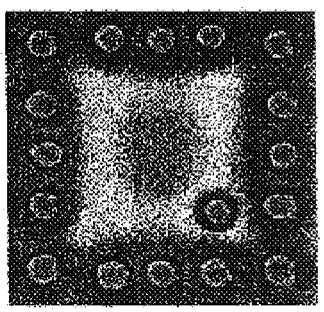
Figure 9I:
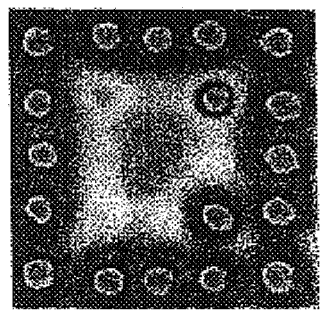
Figure 9J:
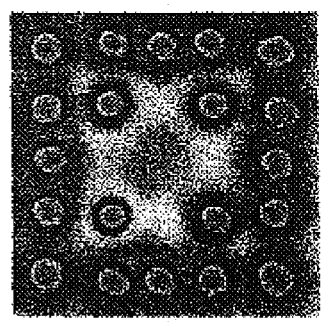
Figure 9K:
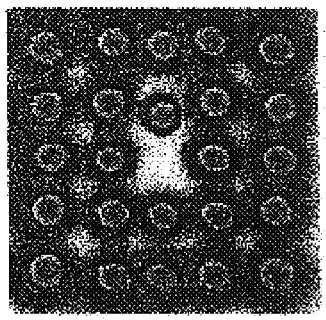
Figure 9L:
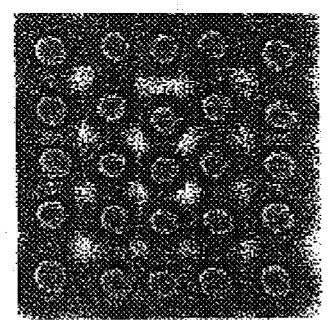

Pattern forming assembly 41 was heated from room temperature to a temperature above the glass transition temperature of the PMMA film 33, and then cooled back to room temperature. During the heat-cool cycle, a press or chuck 51 (shown in FIG. 8b) was used to hold the substrate 31, the spacer 39, and the mask 35 (i.e. the pattern forming assembly) in their respective positions, thereby preventing substantial relative movement and maintaining the mask-substrate separation constant. The open space between the initial PMMA film 33 and the mask 35 gives the PMMA film 33 freedom to deform three-dimensionally. Preferably, the substrate 31 is wet to the deformable material 33. In the case of a silicon substrate, the silicon substrate surface preferably has a thin layer of native oxide, making it a high energy surface and wet to a PMMA melt. In a preferred embodiment of the present invention, the mask surface 47 has a monolayer surfactant, making it a low energy surface and non-wet to a PMMA melt. The heat-cool cycling was performed either in atmosphere or a vacuum of 0.3 torr, which has little effects on the final results. The height of the protruding patterns 37 on the mask 35 is typically micro scale and generally in the range of about 50 nm to about 500 nm (in this example 150 nm).

It was observed that without a mask placed on the top, after a heat-cool cycle, the PMMA film 33 remains flat and featureless. But, with a mask 35 placed a certain distance above the surface of the PMMA film 33, after the same heat-cool cycle, the initially flat PMMA film 33 became self-assembled into periodic supramolecular pillars 49 shown in FIG. 1. The pillars 49 were formed only under the protruding patterns 37 of the mask 35, but not under the recessed areas of the mask 35. The pillars 49 are normal to the substrate 31 and extend all the way from the substrate 31 to the mask 35, making their height generally equal to the initial separation 43 between the substrate 31 and the surface of the mask 35. The location of each pillar 49 as well as the size, shape and lattice structure of the array is determined by the pattern 37 on the mask 35.

Figure 2A:
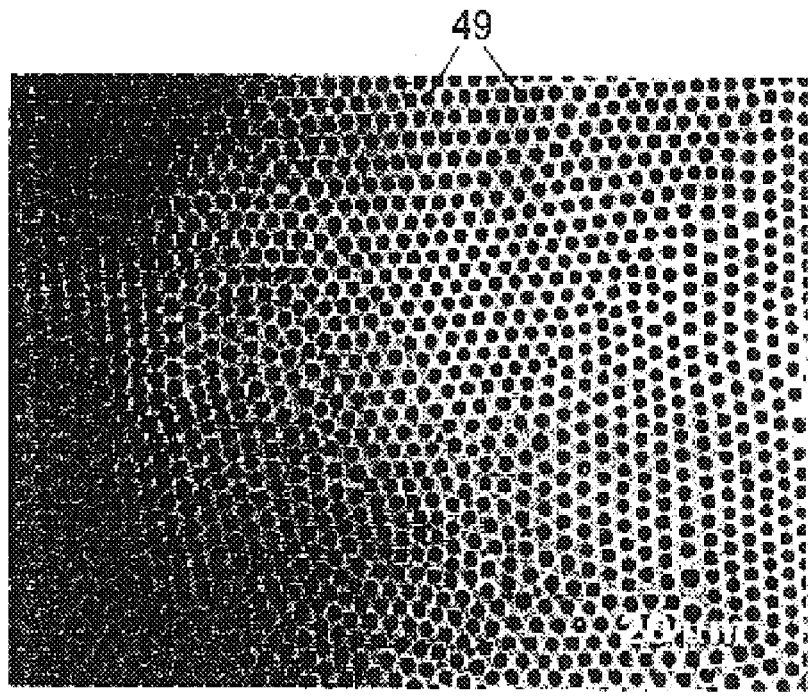
FIG. 2 is an (a) optical and (b) AFM images of periodic pillars formed using a mask of a plain flat surface. The pillars have a closely-packed hexagonal lattice and are multi-domain, covering the entire wafer with a single-domain size of about 50 $\mu$m.
Figure 2B:
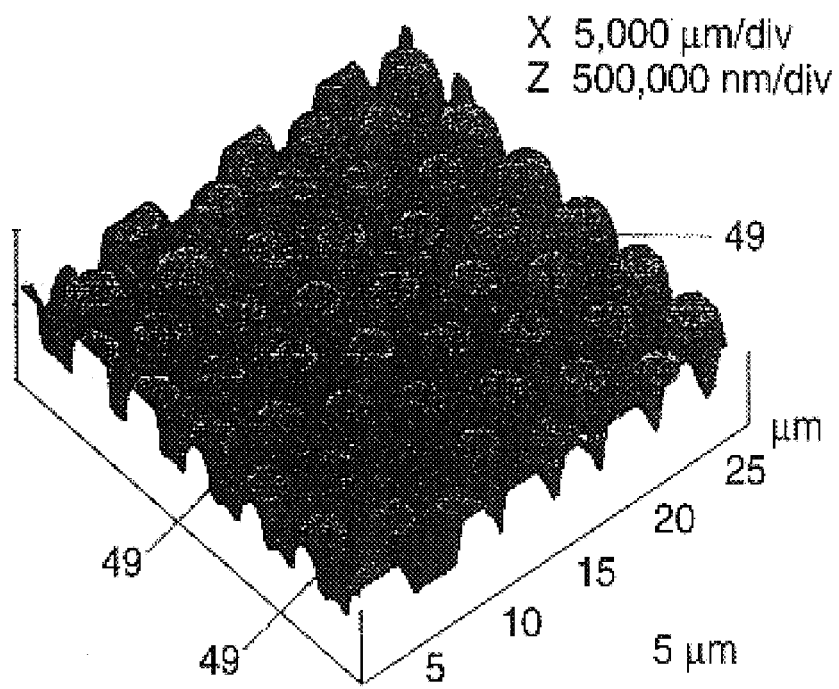

A variety of masks having protruding patterns were made. Masks were formed in a variety of shapes, such as triangles, rectangles squares, lines, and grids. As can be seen in FIG. 2, for a mask without any pattern (i.e., a plain flat surface) placed 165 nm above the surface of the PMMA film, the original flat PMMA film became, after a heat-cool cycle, periodic PMMA pillar arrays with a close-packed hexagonal structure of 3.4 $\mu$m period, 2.7 $\mu$m pillar diameter and 260 nm height. The optical images showed that the array of pillars 49 are multidomain and everywhere over the entire sample. The average size of a single domain is about 50 $\mu$m (i.e.—15 periods). The atomic force microscopy (AFM) showed that the top of each pillar 49 is flat (due to contact with the mask) and the sidewall is quite vertical (due to the tip size effect, the AFM tip is not good for profiling the sidewall). Two-dimensional Fourier transform of the AFM images showed six sharp points arranged in a hexagonal shape in the k-space, further confirming the hexagonal lattice structure of the pillars. The initial PMMA thickness was about 95 nm. The substrate and the mask were heated to 130° C. and were held together for 20 min by a pressure of 300 psi. Then they were cooled down for 10 min to room temperature before being separated.

Figure 3A:
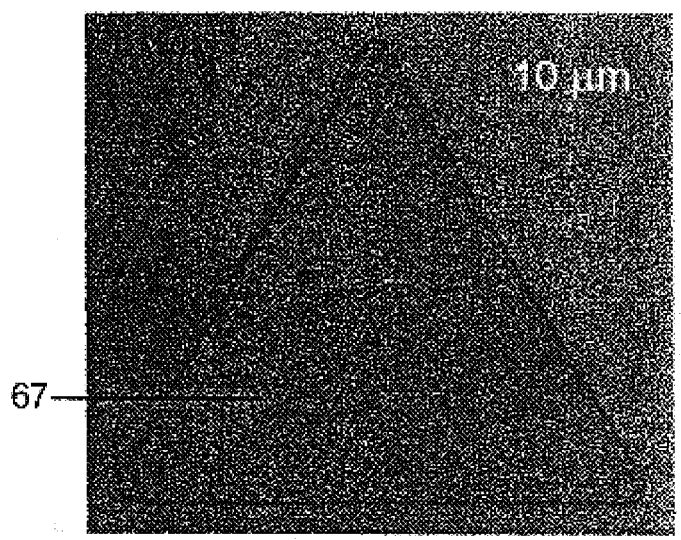
FIG. 3 is an optical micrograph of (a) a protruding triangle pattern on the mask and (b) pillar array formed under the triangle pattern using LISA, and (c) AFM of the pillar array.
Figure 3B:
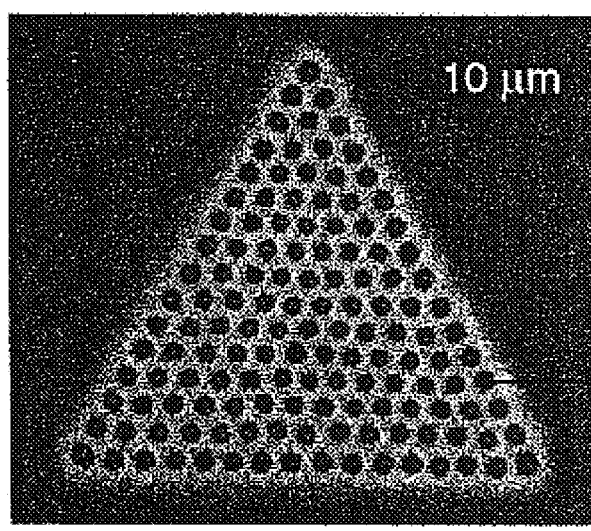
Figure 3C:
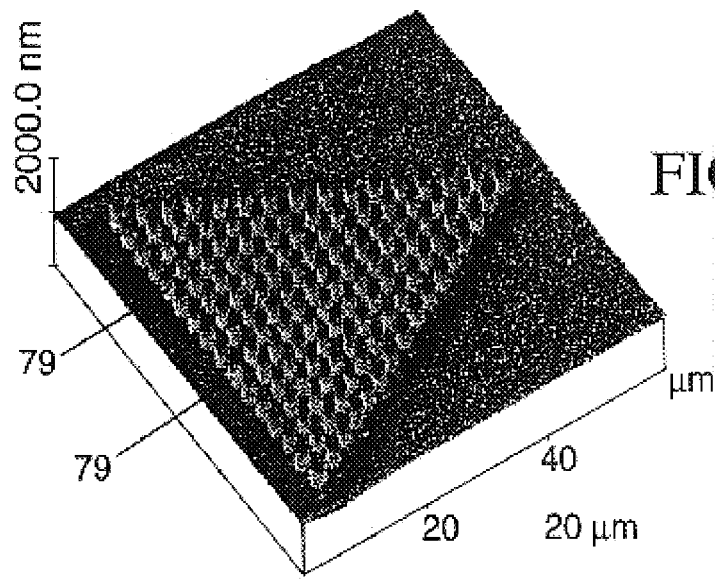

As can be seen in FIG. 3, for a protruding triangle pattern 67 on the mask a single-domain PMMA pillar 79 array of a close-packed hexagonal lattice is formed under the mask pattern 67. Both optical and AFM images show that the shape and size of the pillar 79 array are identical to that of the mask pattern, with the pillars 79 on the edges of the array aligned along the edges of the triangle mask pattern 67. The polymer initially under the recessed area of the mask 35 is depleted after the LISA process and no pillars 79 are formed under the area. In this example initial thickness of the PMMA film 33 was 95 nm. The initial separation between the substrate and the mask pattern 67 was 530 nm. The LISA pillar array is a close-packed hexagonal structure that has a periodicity of 3 $\mu$m, an average pillar diameter of 1.6 $\mu$m. The triangle mask pattern 67 has a side of 53 $\mu$m; a larger size will make the pillar array multi-domain.

Figures 4A, 4B, 4C:
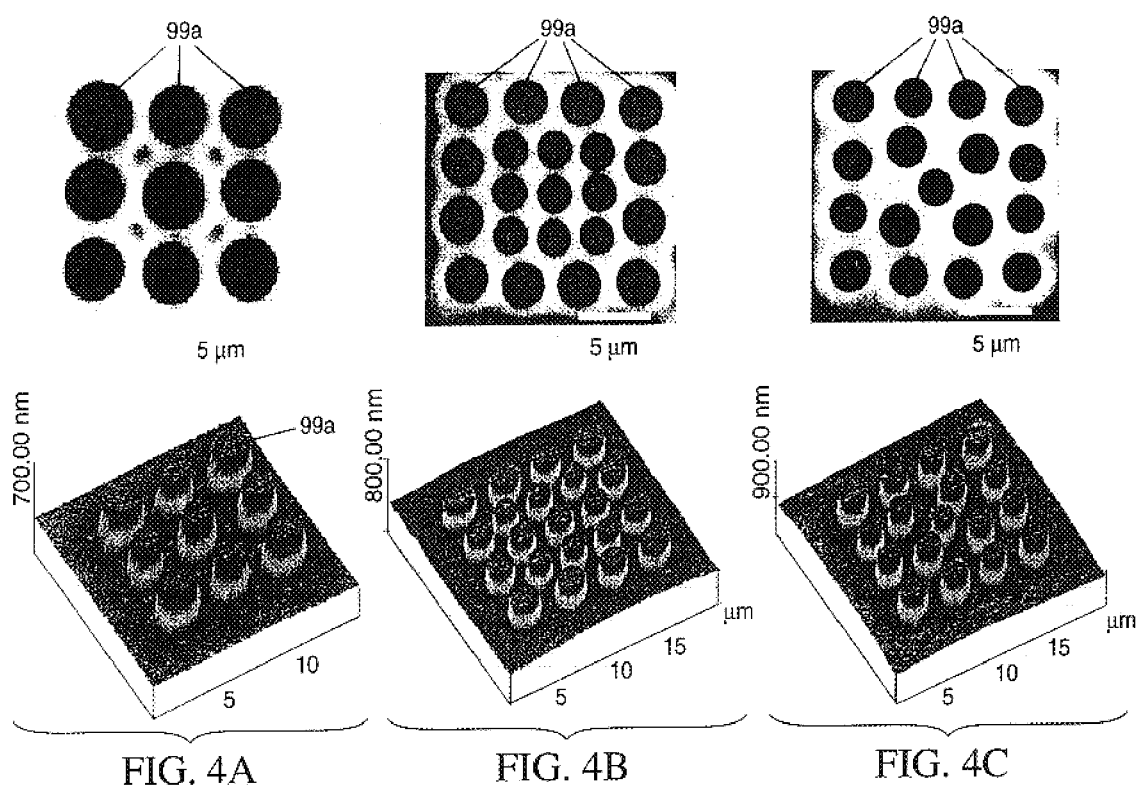
FIG. 4 is an optical and AFM images of the LISA pillar arrays formed under protruding square patterns of a side of (a) 10 $\mu$m, (b) 14 $\mu$m, and (c) 14 $\mu$m. The separation between the mask and the substrate (a) 430 nm, (b) 280 nm, and (c) 360 nm, respectively.

As can be seen in FIG. 4, when the protruding patterns on the mask are rectangles and squares, the pillar arrays 99a formed in LISA also have a shape and size identical to the mask patterns with the pillars 99a at the edges aligned to the edges of the mask patterns, just as in the case of the triangle mask pattern. However, the lattice structures of the pillar arrays are not hexagonal. It appears that the pillars 99a on the edges are formed and aligned to the mask pattern edges first. Then the other pillars will be formed later according to the position of the edge pillars. The shape of the mask and the pillar height determine the final lattice structure of a pillar array. FIG. 4(b) and (c) show that a same mask pattern geometry but different mask-substrate separations lead to two different lattice structures (pillars 99b and 99c). Moreover, the pillars at the edges appear to have a diameter slightly larger than other pillars.

The size and shape of a number mask used in our experiment as well as the diameter, period and height of the pillars formed, in LISA are summarized in Table 1 below.

Table 1 below provides a summary of the geometry of the mask patterns and the LISA Pillars.

TABLE 1

| Mask Geometry | Side Length ($\mu$m) | Pillar Height (nm) | Pillar Period ($\mu$m) | Pillar Diameter ($\mu$m) |
|---|---|---|---|---|
| Plain | N/A | 260 | 3.4 | 2.7 |
| Triangle | 53 | 530 | 3.0 | 1.6 |
| Rectangle | 24 × 12 | 440 | 3.3 | 2.0 |
| Square | 10 | 430 | 3.5 | 2.0 |
|  | 14 | 280 | 3.5 | 2.1 |
|  | 14 | 360 | 3.5 | 2.0 |
| Line | N/A | 530 | 4.8 | 2.1 |

The pillar diameter seems to decrease, with increasing the pillar height (i.e., the separation between the substrate and the mask), that can be understood from the fact that the total polymer volume is constant. The pillar period was found to vary slightly with different mask pattern geometry. Further experiments showed that the pillar period and size depend on the polymer molecular weight. When PMMA of 15K molecular weight (made by a vendor different from 2K PMMA) was used, the pillar period and diameter became about 8 $\mu$m and about 5 $\mu$m, respectively. It was also found that as the heating time could impact pillar formation. An example of high ratio of pillar height to the pillar diameter we achieved is 0.5 (800 nm height and 1.6 $\mu$m diameter).

Figure 5A:
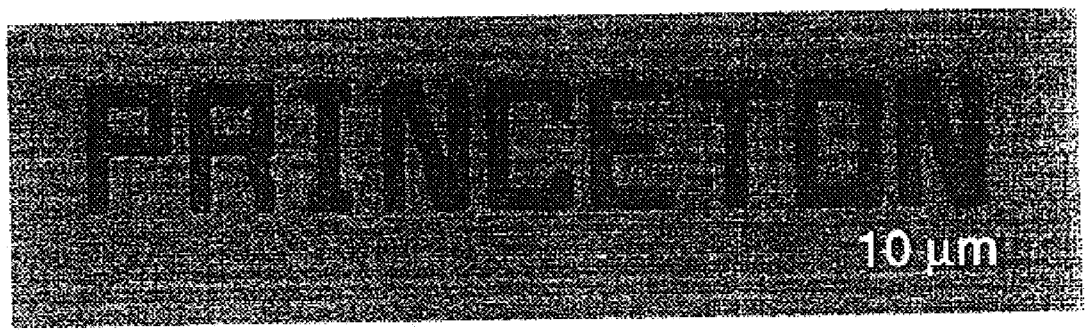
FIG. 5 is (a) optical micrograph of a protruding line pattern spelling "PRINCETON" on the mask and (b) AFM image of pillars formed under the mask pattern.
Figure 5B:
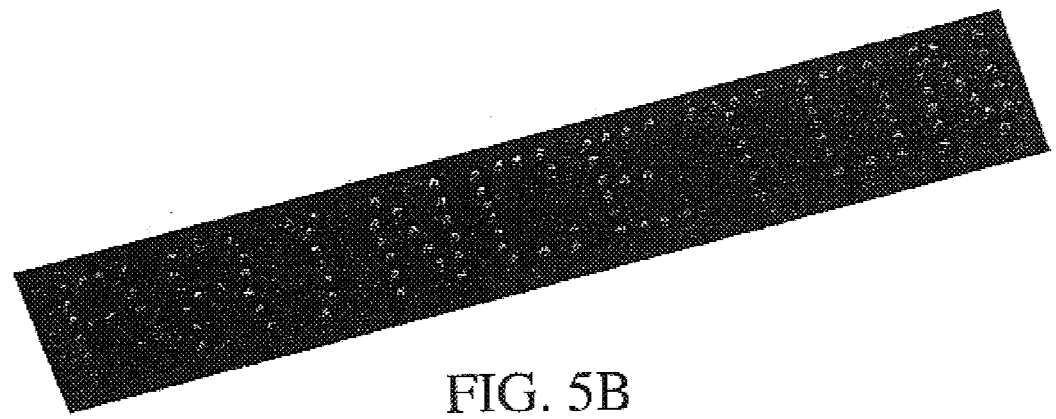

As can be seen in FIG. 5, if the mask pattern is a protruding line of a width less than 5 $\mu$m, a single pillar line will be formed and aligned under the line pattern.

Figure 6:
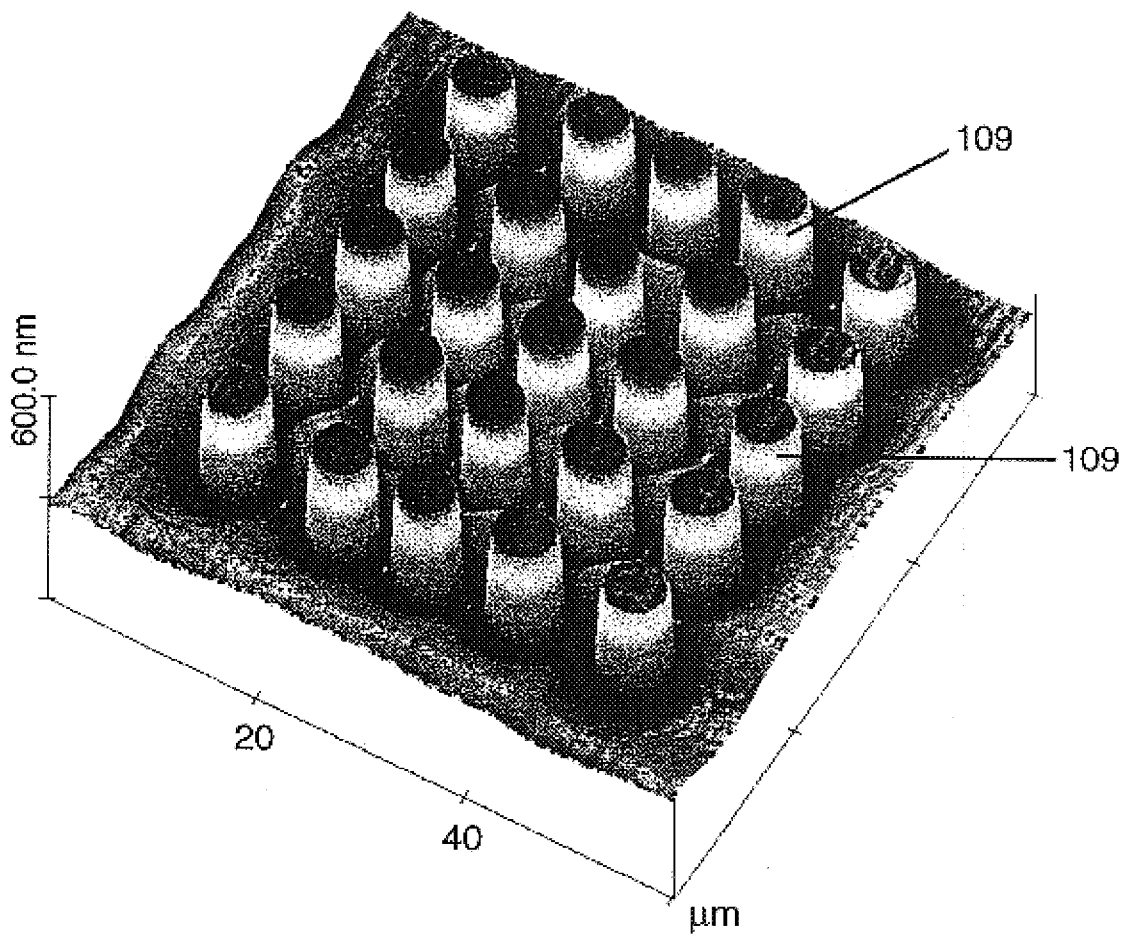
FIG. 6 is an AFM image of a pillar array formed under a grid-line mask pattern with each pillar aligned under an intersection of the grid.

As can be seen in FIG. 6, if the mask pattern is a grid, a pillar 109 is formed and aligned under each intersection of the grid mask pattern. In this case, the pillar 109 period is fixed by the period of the grid on the mask.

In LISA, the plate or mask, when placed a distance above a thin melt film, preferably a single-homopolymer melt film, causes the polymer film, initially flat on another plate, to self-assemble into periodic pillar arrays. The pillars form by raising against the gravitational force and the surface tension, bridge the two plates, having a height equal to the plate-mask separation. If the mask surface has either a protruding pattern, a surfactant pattern (e.g. with a shape of a triangle or rectangle, etc.), or a combination of the two, a pillar array is formed under the pattern with its boundary aligned to the boundary of the mask pattern and with its lattice structure determined by the mask pattern geometry.

To monitor the development of the pattern forming process of LISA in a polymer film, a monitoring assembly 110 was used. The monitoring assembly 110 is shown in FIG. 7b. In this case, the mask was made of glass, thus allowing for observation through the mask using an optical microscope 112. A CCD camera 114 and video recorder 116 with a time resolution of 30 millisecond recorded the pattern forming behavior. The sample consists of 2,000 molecular weight (2K) PMMA polymer 103 cast on a silicon substrate 101 that has a surface that wets the PMMA polymer 103. The glass transition temperature of the PMMA was found to be 96° C. The mask 105 has various patterns of a monolayer of self-assembled surfactant 117. The surfactant 117 was applied to the mask 105 via photolithography and a lift-off. The substrate 101 and mask 105 were separated by a 220 nm spacer 109 and were held together by a metal holder comprised of a chuck 51 and a screw 53 with the pattern forming assembly interposed therebetween. The entire pattern forming assembly 111 was heated by a hot plate 55. The temperature was monitored by a thermocouple mounted on the holder.

The dynamic behavior of a LISA pillar array formation under a square mask pattern is summarized in FIGS. 8 and 9. The PMMA was 135 nm thick. FIG. 8 shows the growth of the first pillar in the array. The sample holder was heated from room temperature to 120° C. and maintained that temperature for the remainder of the experiment. As can be seen in FIG. 8a, before heating the system, the PMMA was featureless. The temperature was increased at a rate of about 10° C./min up to 100° C. and then at 1° C./min after that. Once the temperature exceeded 110° C., a very faint image showing the outline of a pattern could be observed. As can be seen in FIG. 6 this latent image was clearly visible once the system reached 120° C. The beginning of 120° C. was chosen as the zero time reference in FIG. 8. The latent pattern indicates the onset of pattern formation and is visible because the polymer in that region is several tens of nanometers higher than the surrounding film. For a square mask pattern a latent image formed first under the corners of the mask pattern and then the edges. As can be seen in FIG. 8c–e, gradually, the latent image at the corners becomes much more pronounced, indicating the growth of polymer pillars at the corners (FIG. 8c–e). It was observed that one pillar always grew faster than the rest. In this particular example, it took 58 minutes for the first pillar to reach the mask. When a pillar just touched the mask, its image became a black point in the center of a bright circle (see FIG. 8g), and then expanded into a bright dot of 5 $\mu$m diameter in 6 seconds (see FIG. 8i). This suggests that pillars first grow as a cone-shaped spike in the polymer film and then, after touching the mask, reshape into a pillar with a flat top. The mask surface should be a low energy surface to limit the distance that a pillar can spread.

FIG. 9 shows the growth behavior from the first pillar to the last pillar of a LISA array formed under the square mask pattern. The time zero in this figure is set at the completion of the first pillar. The formation of the second pillar was completed 9 seconds after the first pillar, in a corner of the mask pattern adjacent to the first pillar (See FIG. 9b). The third pillar was completed 58 seconds later and was in a corner adjacent to the second pillar (See FIG. 9c). And the fourth pillar was formed at 2 min 59 seconds (See FIG. 9d). After the pillars at the corners were completed, new pillars started to form at the edges of the mask pattern (See FIG. 9e–g). A new edge pillar was observed to always form adjacent to an existing pillar. After the first ring of pillars was completed, which took about 50 minutes beyond the first pillar formation, the second latent pattern images formed just inside the ring.

Figure 10:
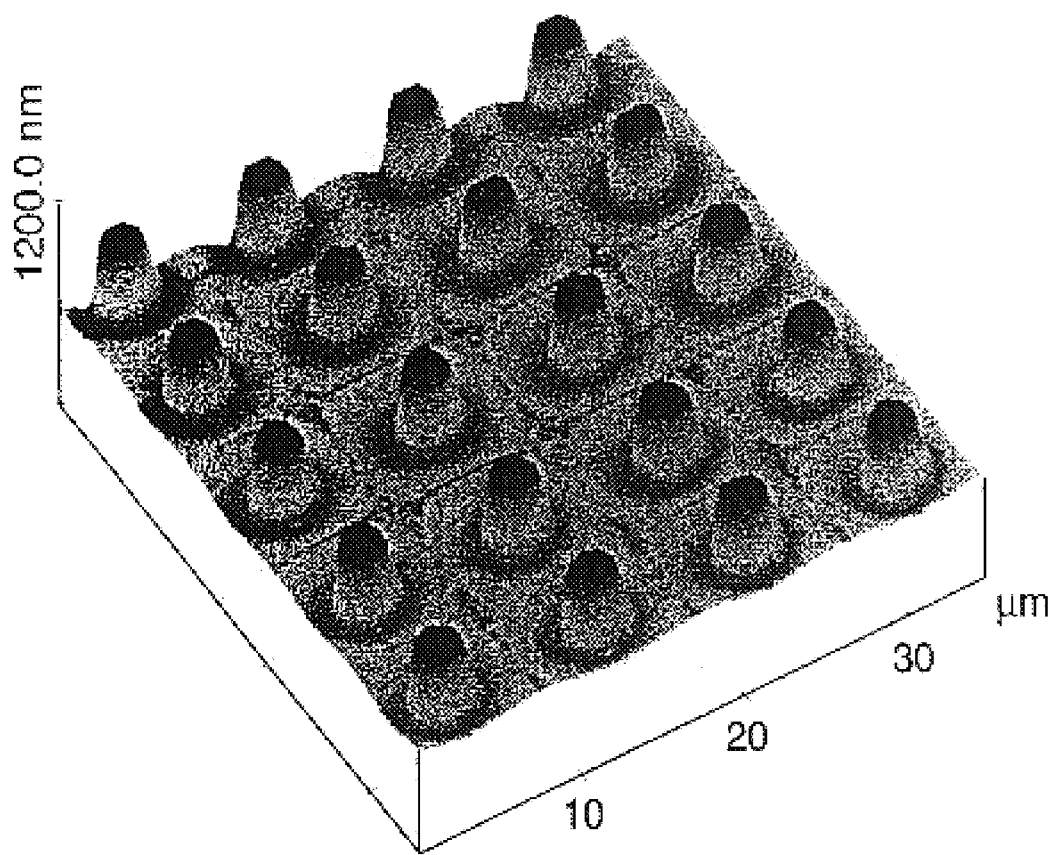
FIG. 10 is the atomic force image of the same LISA pillar array (5×5 pillars) as in FIGS. 8 and 9. The pillars with a flat top have a height, diameter, and period of 310 nm, 5 $\mu$m and 9 $\mu$m, respectively. The array has a simple cubic lattice.

In a fashion similar to the formation of pillars in the first ring, a new pillar was formed at a new corner, then the adjacent corners, later the new edges. As the process continued, pillar formation propagated from the corners to the edges and from outside to inside (See FIG. 9h–l). Similar dynamic behavior has been observed in square patterns with different sizes as well as with mask patterns with different shapes (e.g., triangles and rectangles). The atomic force microscope image of the LISA pillar array shown in FIG. 10 shows that the diameter of each pillar is uniform and that the top of each pillar is substantially flat. The pillar height, diameter, and period is 310 nm. 5 $\mu$m, and 9 $\mu$m, respectively. The measured height suggests that the actual mask-substrate spacing was 310 nm and that the spacer was pressed 45 nm into the PMMA.

While not wishing to be bound by theory, FIG. 11 illustrates a proposed model for the formation of periodic supramolecular pillar arrays in a film utilizing the LISA process. LISA appears to occur in four stages. The first stage is the surface roughening shown in FIG. 11a. When a polymer 133 is heated above its glass transition temperature, it becomes a deformable and/or viscous liquid than can flow. Since there is an open space between the polymer 133 and the mask 135, the polymer 133 will flow and deform three-dimensionally to relieve the polymer film's internal stress and surface tension, roughening the surface of the polymer film surface.

Figure 11A:
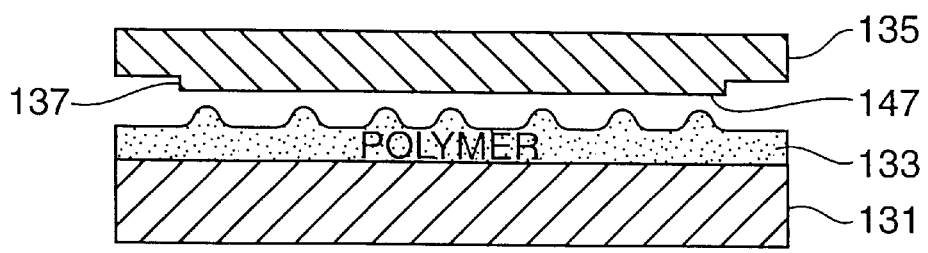
FIG. 11 schematically illustrates a proposed model for LISA: (a) surface roughening, (b) roughening enhancement due to a long range attractive force, (c) pillar formation, and (d) self-organization.
Figure 11B:
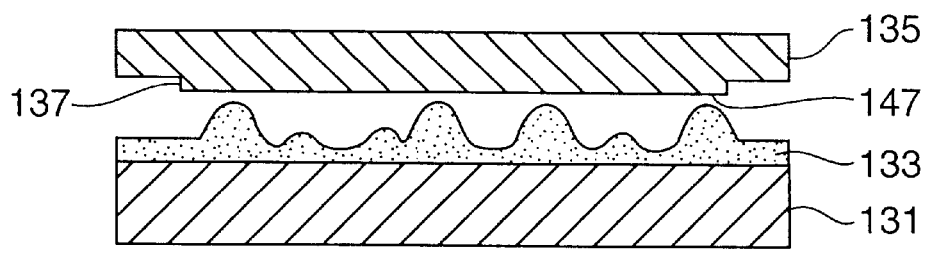

The second stage is the enhancement of the polymer surface roughening shown in FIG. 11b. Placing a mask 135, preferably a dielectric mask polymer 133, on top of the PMMA can create a Van der Waals attractive force, which is long-range and inversely proportional to a power of the distance between the film 133 and the mask 135. The closer to the mask 135, the larger the attractive force on the polymer 133, making the film roughness grow until some polymer touches the surface 147 of the mask.

Figure 11C:
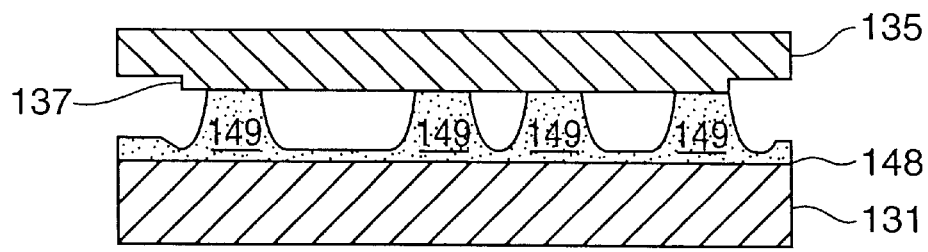

The third stage is the pillar 149 formation shown in FIG. 11c. In order to minimize the total free energy, the low energy surface of the mask forces the polymer melt 133 to ball up on the mask surface 147, forming round pillars 149. On the other hand, the high energy surface of the substrate 131 always keeps its surface 148 covered with a thin layer of polymer 133. The thin film layer connects all polymer pillars 149, allowing a polymer mass flow between the pillars 149. The thin film layer also acts as a polymer reservoir, supplying polymer to the pillars 149. The connectivity and the polymer mass-transfer equalize the pressure inside all pillars, and hence the pillar diameter. The final diameter of a pillar 149 also depends on the other forces applied to the pillar 149, as discussed in the next paragraph.

Figure 11D:
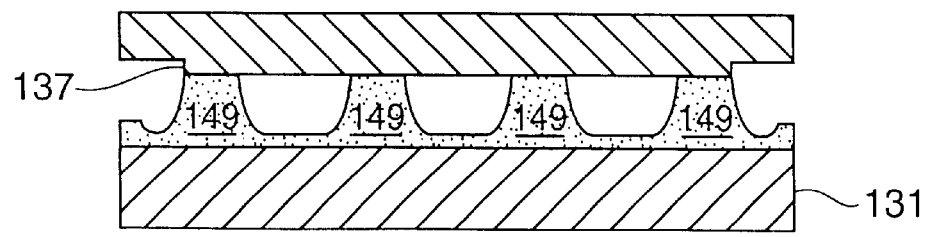

The fourth and final stage is the self-organization shown in FIG. 11d. Initially, the polymer pillars 149 have random locations and various diameters, and can move around inside the area defined by a mask pattern 137. But, once a pillar 149 moves to an edge of the mask pattern 137, part of its triple-phase line (i.e. the line that intersects the liquid, solid and vapor phase) is trapped to the edge, limiting the pillar's movement to only along the edge. When a pillar 149 reaches a corner of the mask pattern 137, another part of its triple-line is trapped by another edge. Then that pillar cannot move any more, trapped at the corner, because a pillar 149 cannot move in two different directions at the same time; breaking away from one of the edges requires extra energy and is unlikely. Once pillars occupy the corners, other pillars start to self-organize on the edges. When the self-organization on the edges finishes, the self-organization of pillars propagates gradually into the center of the mask pattern 137. During the cooling process, the polymer pillars solidify and maintain the self-assembled patterns.

It appears the self-organization of pillars is due to the balance between long-range attractive force and the short-range repulsive force. The attractive force brings the pillars close together, while the repulsive force keeps the pillars apart. The cross-over of the two forces fixes the distance between the pillars. This is similar to the self-organization in colloids. We believe that the surface of the PMMA in this case has like-charges. Therefore, the pillars appear to be attractive when they are a certain distance away, but repulsive when the pillars are very close. The attractive force between like-charges could be induced by the substrate and mask, similar to the situation of two microspheres between two glass walls. In the self-organization stage (the fourth stage), the pillar diameter continues to adjust to balance the surface tension, the repulsive force and the attractive force. Since the pillars at corners have less repulsive force than those in the center, the diameter of the corner pillars is slightly bigger, as observed in our experiments.

From the above observations and others, it appears that the LISA process is related to (i) a long-range attractive force between the polymer melt film and the mask, (ii) the hydrodynamic forces in the polymer melt, (iii) the surface tension, and (iv) the interplay of all the forces. The long range force could be electrostatic, dipole, or Van der Waals forces, or a combination of all. It appears that electrostatic force is the driving force. The patterns are formed as a result of interplay and instability of charges in a polymer melt, image charges in a mask, and hydrodynamic force in the polymer melt. We observed that because the polymer melt thickness is ultra-thin, LISA is not due to the instabilities from the thermal convection (Rayleigh-Benard instability) or the surface tension driven Benard convention, which also could lead to the pattern formation.

If there is no mask placed on top of the PMMA melt, the charges in the PMMA film should be uniformly distributed due to a flat surface and symmetry. However, if there is a mask with a finite conductivity placed near the PMMA melt, an image charge will be induced in the mask. The interplay of the charges and the image charges can cause instability and pattern formations. Again, not wishing to be bound by theory, we consider the case that the mask has a protruding square. Since the charge tends to accumulate at corners, there will be more image charge in the corners than other places on the protruding square, causing a nonuniform charge distribution in the mask. The nonuniform distribution of the image charge will cause redistribution of the charges in PMMA film. The process continues in a positive feedback fashion. Eventually, enough charges and image charges will build up at the corners of the square mask pattern and in the PMMA areas under the corners, so that the electrostatic force between the corners of the mask patterns and the PMMA under the corners exceeds the gravitational force, The PMMA melt in those areas, which initially were flat, starts to be pulled up into smaller cones. The charge will move into the sharp point of the cones, hence inducing more image charges at the corners of the mask. If the mask is not too far away from the PMMA, the charges and the image charges will build up a local electric field, that can overcome the surface tension. In this case, the small PMMA cones will grow. The growth will reduce the distance between the charges and the image charges, hence increasing the strength of the electrostatic force and speeding up the growth. Finally the PMMA pillars reach the mask, forming a full pillar. Once the full PMMA pillars are formed at the corners, the charges and image charges must redistribute. The pillars formed become a boundary for the capillary waves in the PMMA melt surface. The capillary wave, a linear wave of amplitude of about one-hundredth of the film thickness (less than 1 nm in our case) will form standing waves set by the boundary. If the standing wave peak next to a boundary pillar has an amplitude slightly larger than the rest of the peaks, more charges will be accumulated in that peak and more image charges in the mask area above the peak, making the peak grow into a full pillar. Once the pillars reach the mask, the process will repeat, until all small amplitude capillary peaks under the mask protruding patterns develop into full pillars.

Therefore, the formation of the PMMA pillars starts at the corners, then the edges, and later propagates into the center of the mask protruding pattern. On the other hand, the polymer under the recess areas of the mask is too far away to have an electrostatic force to overcome surface tension to develop into full pillars.

The protruding patterns on the mask guide the boundary of the pillar array. The pillar array has a size, shape and period, that are not only different, but smaller than the features on the mask. Such demagnification is technologically significant and could be used repeatedly to achieve even smaller patterns. With a suitable set of polymers of desired properties (e.g., viscosity, surface tension, etc) and a repeated usage of LISA. The diameter of the pillars can be "demagnified". Furthermore, LISA showed for the first time the role of trapping the three-phase lines by a mask pattern in self-organization of a polymer melt.

The LISA process would appear to be applicable to other polymers and materials, especially single phase materials, such as semiconductors, metals, and biological materials. The periodic arrays formed by LISA have many applications, such as memory devices, photonic materials, new biological materials, just to name a few. With a proper design, a single crystal lattice of pillar array with predetermined diameter, period location, and orientation could be achieved over an entire wafer.

Utilizing the principles elucidated in LISA, we have been able to control the surface energy and form patterns with a size identical to the patterns on the mask can be formed. We refer to this as lithographically-induced self-construction (LISC). It differs from LISA in that the relief pattern is substantially identical in lateral dimensions to the patterns on the mask as opposed to the pillar arrays found in LISA. LISC offers a unique way to pattern polymer electronic and optoelectronic devices directly without using the detrimental photolithography process.

Figure 12A:
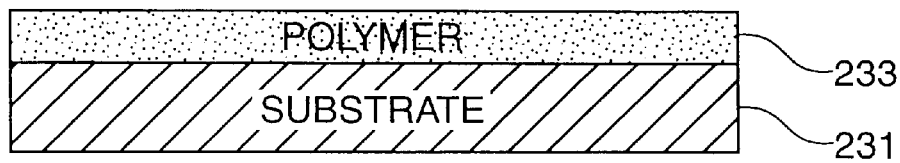
FIG. 12 schematically illustrates lithographically induced self-construction ("LISC") schematic of LISC: (a) a thin polymer film cast on a flat substrate (e.g. silicon), (b) a mask with protruding patterns placed a distance above the polymer film, (c) during a heat-and-cool cycle, the polymer film self-constructs into a mesa under a mask protrusion. The mesa has a lateral dimension identical to that of the mask protrusion, a height equal to the distance between the mask and the substrate, and a steep side wall.
Figure 12B:
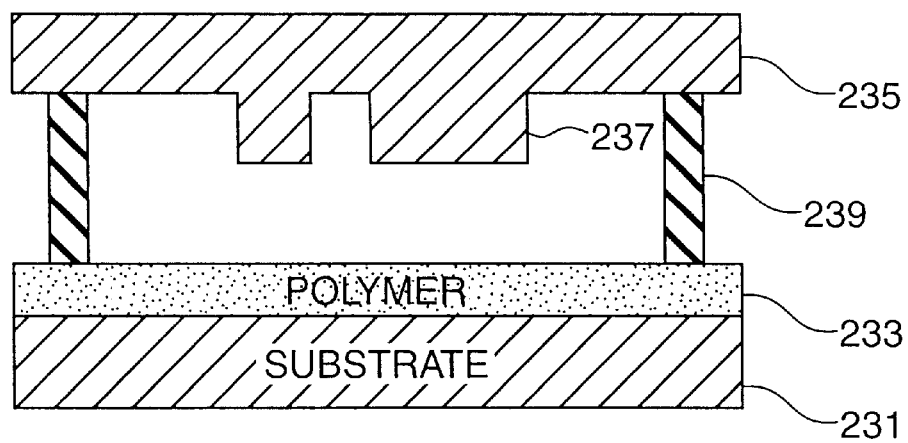
Figure 12C:
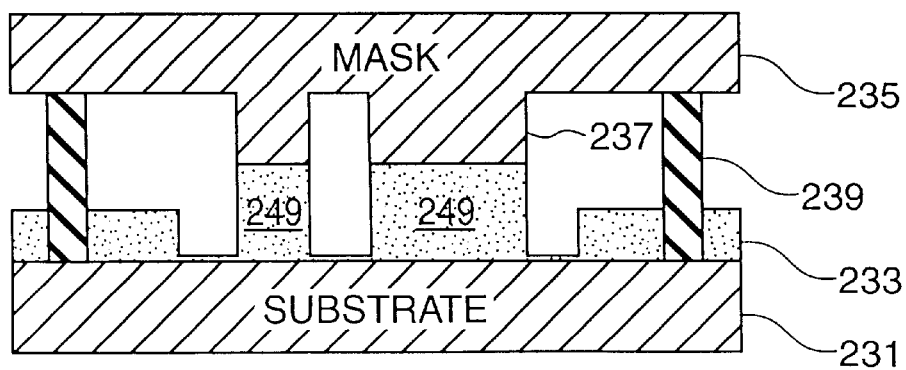

As can be seen in FIG. 12, in LISC, a mask 235 with a protruded pattern 237 is placed a certain distance above an initially flat polymer 233 that is cast on a substrate 231. During a heating process that raises the temperature above the polymer's glass transition temperature and during cooling back to the room temperature, the polymer was attracted, against gravitational force and surface tension, to mask protrusions 237, but not to the recess areas of the mask, forming the polymer mesas 249 on their own. The mesas have a lateral dimension substantially identical to the protruded patterns on the mask 235, a height equal to the distance between the mask 235 and the substrate, and a relatively steep sidewall.

In the LISC experiments, both the mask and the substrate are made of silicon. The protrusions with a variety of shapes have a height of ~300 nm. The polymer is polymethal methalcrylate (PMMA) which was spin-cast on the substrate and was baked at 80° C. to drive out the solvent. The molecular weight and thickness is typically 2000 and 100 nm, respectively. The gap between the initially flat polymer film and the mask protrusions ranged from 100 to 400 nm, and was controlled by a spacer. The temperature was cycled from room temperature to 170° C. The heat was from the top and bottom of the sample, making the thermal gradient on the sample very small. A press was used to supply the heat and to hold the gap constant. A surfactant with a low surface energy was coated on the mask to facilitate the mask-sample separation after LISC. We found that the materials (for the mask and substrate) and the parameters (e.g., the protrusion height, polymer thickness, polymers molecular weight, gap, etc.) are not very critical to LISC. LISC can be formed over a wide range of these parameters. The typical diameter of the masks and substrate is larger than 2 cm. The masks are made by photolighography and etching. The temperature was cycled to 175° C. At present, the minimum size of the polymer microstructures formed by LISC is limited by the patterns on the mask. However, the demagnification effect observed in LISA could be used to form a resist wherein the substrate is etched in the recessed areas of the pattern to thereby form smaller and smaller patterns on masks.

Figure 13A:
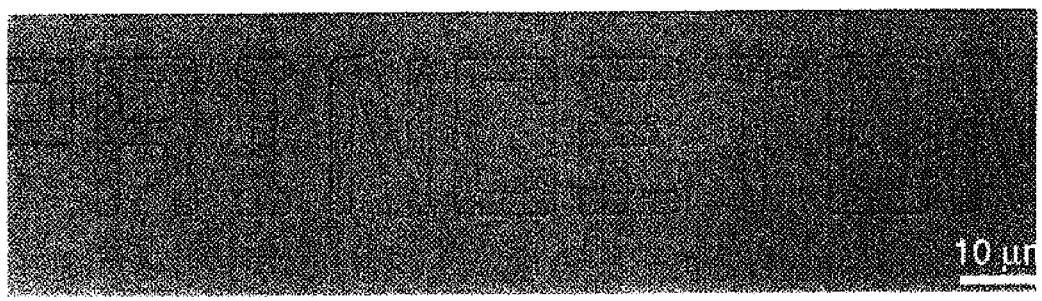
FIG. 13 shows (a) optical image of protruded pattern of "PRINCETON" on the mask, and (b) AFM image of the LISC patterns formed underneath the mask pattern. The LISC pattern duplicates the lateral dimension of the mask pattern.
Figure 13B:

To further test the ability of LISC in forming an arbitrary pattern, we again created the protrusions of the word "PRINCETON" on a LISC mask. This is shown in FIG. 13, comparison of PMMA LISC patterns with the mask showed that the polymer mesas formed in LISC duplicate the patterns on the mask very well. The linewidth and the height of the pattern is 3 $\mu$m and 230 nm respectively. The initial PMMA film thickness is only 100 nm.

In LISA, an array of periodic polymer pillars was formed under a single mask protrusion, instead of a single polymer mesa with the same lateral dimension as the mask protrusion is formed as in LISC. The key to have a LISC rather than LISA appears to reduce the difference of the surface tensions of the polymer and the mask. When the difference is small enough, each polymer pillar formed in the initial phase of LISC will spread and merge with other pillars to form a single mesa under each mask protrusion. Either using a different surfactant on the mask or increasing the processing temperature (which would reduce the polymer surface tension) can reduce the surface tension difference.

Another embodiment of the present invention is self-aligned self-assembly (SALSA) of random access electronic device arrays. The conventional approach in fabricating such an array is to fabricate each individual device first, then connect them with word lines and bit lines. As the devices become smaller, the precision alignment between the wires and devices becomes more difficult to fabricate, substantially increasing the fabrication cost. Using the LISA principle, we can first fabricate a word-line array and a bit-line array in two different substrates, and then let the device self-assemble between the word-line and bit-line. FIG. 14 illustrates the applicability of SALSA to Random Access Electronic Devices. A word line assembly is fabricated utilizing a silicon wafer as is known in the art (e.g., by acid etching). Similarly, a bit line is fabricated with a silicon wafer as is known in the art. A thin film or polymer 73 (e.g., PMMA) is deposited on the word line assembly 77. The bit line 75 is placed a pre-determined distance above the word line 77 or vice versa, e.g. a distance of less than 1 micron and preferably in the range of about 100 to 400 nm. The temperature is cycled from room temperature to the glass transition temperature of the polymer 73 and then cooled back down, to thereby form a pillar structure at the juncture of each word/bit line.

Although the present invention has been described with reference to preferred embodiments, one skilled in the art will recognize that changes may be made in form and detail without departing from the spirit and scope of the invention.

What is claimed is:

1. A method of forming a pattern on a surface comprising:

placing a mask above a substrate having a surface layer that is deformable;

maintaining the mask at a substantially constant distance above the substrate; and allowing self-assembly of a pattern between the mask and the surface layer of the substrate, said step of allowing self-assembly of a pattern including rendering the surface layer of the substrate deformable.

2. The method of claim 1, wherein said surface layer that is deformable is a thin film of a material deposited on the substrate.

3. The method of claim 2, wherein said material is rendered deformable by heating the material to the material's glass transition temperature.

4. The method of claim 2, wherein the substrate is selected from the group consisting of semiconductors, dielectrics, metals, polymers and combinations thereof.

5. The method of claim 1, wherein said pattern is comprised of a plurality of pillars.

6. The method of claim 5, wherein said plurality of pillars is in a periodic array.

7. The method of claim 1, wherein the surface layer that is deformable comprises a thermoplastic polymer.

8. The method of claim 1, wherein said pattern has a height of about 10 nm to about 1,000 nm.

9. The method of claim 1, wherein said pattern is substantially identical in lateral dimensions to said mask.

10. The method of claim 1, wherein lateral dimensions of said pattern are smaller than lateral dimensions of said mask.

11. A method of forming a pattern on a surface comprising:

placing a mask above a substrate having a surface layer material that is deformable, said surface layer material being selected from the group consisting of a homopolymer, a copolymer, a polymer blend, a liquid, a liquid polymer, liquid crystals, a semiconductor, a metal, and a dielectric material;

maintaining a separation between said mask and the substrate at a constant distance;

allowing self-assembly of a pattern between said mask and said surface layer.

12. The method of claim 11, wherein the step of allowing self-assembly of a pattern includes rendering said surface layer material deformable.

13. The method of claim 11, wherein said surface layer material that is deformable is a thin film deposited on the substrate.

14. The method of claim 13, wherein the substrate is selected from the group consisting of semiconductors, dielectrics, metals, polymers and combinations thereof.

15. The method of claim 11, wherein said pattern is comprised of a plurality of pillars.

16. The method of claim 15, wherein said plurality of pillars is in a periodic array.

17. The method of claim 11, wherein said pattern has a height of about 10 nm to about 1,000 nm.

18. The method of claim 11, wherein said pattern is substantially identical in lateral dimensions to said mask.

19. The method of claim 11, wherein lateral dimensions of said pattern are smaller than lateral dimensions of said mask.

20. A method of forming a pattern on a surface, comprising the steps of:

obtaining a substrate;

depositing a polymer film on the substrate;

placing a mask above the polymer film on the substrate, said mask having a protruding feature; and maintaining a mask substrate separation constant and heating the polymer film to thereby form a contact between said film and said protruding feature to self-assemble a pattern between the polymer film and the protruding feature of said mask.

21. The method of claim 20, wherein said pattern is substantially identical in lateral dimensions to the protruding feature of said mask.

22. The method of claim 20, wherein lateral dimensions of said pattern are smaller than lateral dimensions of the protruding feature of said mask.

* * * * *